(12) United States Patent
Waayers

(10) Patent No.: US 9,465,072 B2
(45) Date of Patent: Oct. 11, 2016

(54) METHOD AND SYSTEM FOR DIGITAL CIRCUIT SCAN TESTING

(71) Applicant: NXP B.V., Eindhoven (NL)

(72) Inventor: Tom Waayers, Sint Michielsgestel (NL)

(73) Assignee: NXP B.V., Einhoven (NL)

( * ) Notice: Subject to any disclaimer, the term of this patent is extended or adjusted under 35 U.S.C. 154(b) by 0 days.

(21) Appl. No.: 14/658,008

(22) Filed: Mar. 13, 2015

(65) Prior Publication Data

US 2016/0266201 A1    Sep. 15, 2016

(51) Int. Cl.
*G01R 31/3185*    (2006.01)
*G01R 31/3177*    (2006.01)
*G01R 31/317*    (2006.01)

(52) U.S. Cl.
CPC ..... *G01R 31/3177* (2013.01); *G01R 31/31727* (2013.01); *G01R 31/318536* (2013.01); *G01R 31/318547* (2013.01); *G01R 31/318552* (2013.01)

(58) Field of Classification Search
CPC .............. G01R 31/31727; G01R 31/318536; G01R 31/3177

USPC .................................................. 714/726, 731
See application file for complete search history.

(56) References Cited

U.S. PATENT DOCUMENTS

| | | | | |
|---|---|---|---|---|
| 6,748,563 B1* | 6/2004 | LeBlanc | .......... | G01R 31/31858 714/724 |
| 7,509,549 B2* | 3/2009 | Larson | ................ | G06F 11/2242 714/724 |
| 7,788,558 B2* | 8/2010 | Shimooka | ........ | G01B 31/31853 714/726 |
| 8,375,265 B1* | 2/2013 | Venkatasubramanian | | G01R 31/31858 714/727 |
| 8,458,543 B2* | 6/2013 | Tung | ................ | G01B 31/31854 714/726 |
| 8,677,201 B2* | 3/2014 | Itou | .................. | G01B 31/31854 714/726 |

* cited by examiner

*Primary Examiner* — James C Kerveros

(57) ABSTRACT

Embodiments of methods and systems for digital circuit scan testing are described. In one embodiment, a method for scan testing a digital circuit involves testing a digital circuit using a scan chain to generate scan data and distributing the scan data over a plurality of scan output terminals using a sample and hold device.

18 Claims, 14 Drawing Sheets

METHOD AND SYSTEM FOR DIGITAL CIRCUIT SCAN TESTING

A circuit can be tested through a scan chain, which provides access to sequential elements of the circuit in a test mode of operation. For example, through a scan chain, access stimulus values can be transported from a tester device towards sequential elements of a digital circuit and response values can be transported from the digital circuit towards the tester device to be compared with expected values.

In a typical circuit testing system, the drive strength of peripheral terminals/buffers that communicate response data towards a tester device is limited. For example, a circuit testing system for a low power application typically has peripheral terminals/buffers with low drive strength. Consequently, the frequency at which the scan test shift operation can be executed (i.e., test/scan frequency) can be limited. However, a relatively low test frequency translates into a relatively long test time, which is undesirable for high speed circuits.

Embodiments of methods and systems for digital circuit scan testing are described. In one embodiment, a method for digital circuit scan testing involves testing a digital circuit using a scan chain to generate scan data and distributing the scan data over scan output terminals using a sample and hold device. Because the scan data is distributed over the terminals, each scan output terminal can have a lower frequency, which allows a peripheral buffer with lower drive strength enough time to drive/transmit the scan data. Consequently, a higher scan frequency can be enabled by using multiple scan output terminals for one scan chain.

Other aspects and advantages of embodiments of the present invention will become apparent from the following detailed description, taken in conjunction with the accompanying drawings, depicted by way of example of the principles of the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
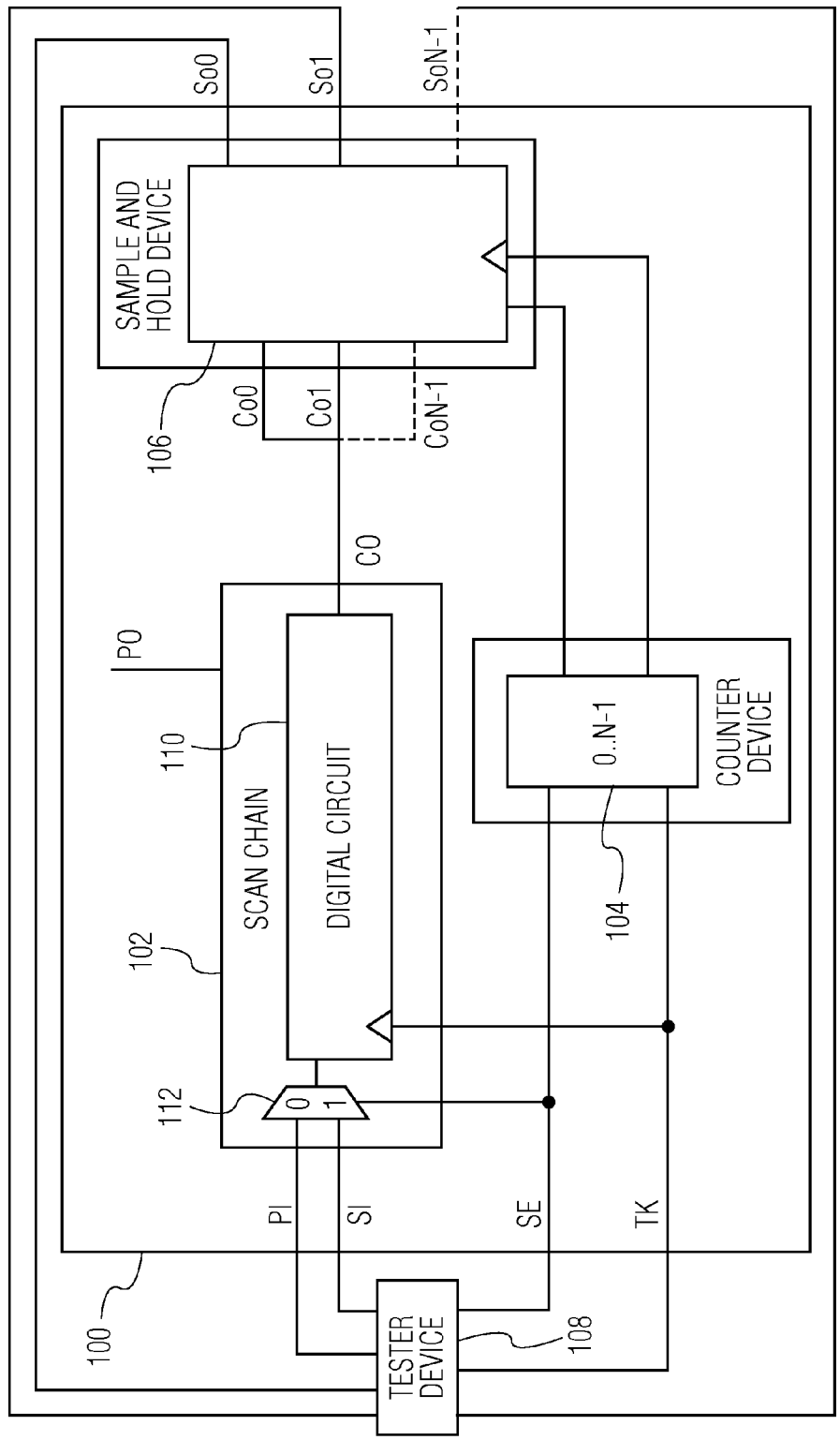
FIG. 1 is a schematic block diagram of a circuit testing system in accordance with an embodiment of the invention.

FIG. 1 is a schematic block diagram of a circuit testing system 100 in accordance with an embodiment of the invention. In the embodiment depicted in FIG. 1, the circuit testing system includes a scan chain 102, a counter device 104, and a sample and hold device 106. In some embodiments, the circuit testing system 100 receives test data (e.g., test scan sequence) and test clock signals from a tester device 108 and sends scan data, which contains test result information, to the tester device. Subsequently, the tester device can compare the scan data with expected values to detect circuit defects. The circuit testing system can be used for circuit testing, including, analog circuit testing and digital circuit testing. For example, the circuit testing system can be used to test flip-flops, digital logic circuits, and other digital integrated circuits (ICs). In some embodiments, the circuit testing system is used to test automotive In-Vehicle Networking (IVN) devices. The circuit testing system can be used to test digital circuits with an even number of scan chain elements and digital circuits with an odd number of scan chain elements. Although the circuit testing system is shown in FIG. 1 as including certain components, in some embodiments, the circuit testing system includes less or more components to implement less or more functionalities. For example, the circuit testing system may include a scan chain de-compressor that decompresses test data for the scan chain and/or a scan chain compactor that compresses scan data that is generated by the scan chain.

The scan chain 102 of the circuit testing system 100 contains/hosts a circuit under test, which is a circuit that can be tested by the circuit testing system 100. In some embodiments, the scan chain contains/hosts a digital circuit under test 110. The digital circuit may include digital circuit elements that are serially or sequentially connected, such as sequentially connected flip-flops, that can be tested based on a test scan sequence received at the scan chain. In the embodiment depicted in FIG. 1, the scan chain includes a multiplexer 112, from which a primary input signal, "PI," and a scan input signal, "SI," are input and to which a scan enable signal, "SE," is applied. The primary input signal, PI, is used to carry normal operational data for a regular operation of the digital circuit while the scan input signal, SI, is used to carry a test scan sequence for a scan operation (e.g., a scan shift operation) of the digital circuit. The selection between the primary input signal, PI, and the scan input signal, SI, is governed by the scan enable signal, SE. A test clock signal, "TK," is supplied to the digital circuit and the scan chain is configured to test the digital circuit in response to the test clock signal, TK, to generate scan data. Under a test mode, the scan chain generates a chain output signal, "CO," which is output to the sample and hold device while under a normal operation mode, the digital circuit generates a primary output signal, "PO," based on the primary input signal PI. In the embodiment depicted in FIG. 1, the primary input signal, PI, the scan input signal, SI, the scan enable signal, SE, and the test clock signal, TK, are generated and supplied to the scan chain by the tester device 108. However, in other embodiments, the scan enable signal, SE, and the test clock signal, TK, are generated and/or provided by multiple different circuits.

The counter device 104 of the circuit testing system 100 is configured to divide the frequency of the test clock signal, TK, to schedule scan data that is generated by the scan chain 102. In some embodiments, the number of counter stages defines the frequency division. The scan data can be scheduled such that on each scan output terminal, "So," a lower frequency is observed by the device tester. The lower frequency allows a scan output terminal with lower drive strength enough time to drive the proper logic value. In the embodiment depicted in FIG. 1, the counter device is supplied with the clock signal, TK, and driven by the scan enable signal, SE, which is used to provide a defined and repeatable start during the shift operation of the scan chain. The defined start enables simple automation that translates response data independent of the scan chain organization having an odd length or an even length.

The sample and hold device 106 of the circuit testing system 100 is configured to distribute the scan data that is generated by the scan chain 102 over a number of scan output terminals. In the embodiment depicted in FIG. 1, the sample and hold device is located in the scan output path of the scan chain and receives the scan data from a number of chain output (Co) pins/terminals, "Co0," "Co1," ... "CoN−1," where N is an integer that is larger than 1. The sample and hold device then distributes the scan data over a number of scan output (So) pins/terminals, "So0," "So1," ... "SoN−1." Because the scan data is distributed over multiple scan output terminals, each scan output terminal can have a lower frequency, which allows a peripheral buffer with lower drive strength enough time to drive/transmit the scan data. Consequently, a higher scan frequency can be enabled by using multiple scan output terminals for one scan chain.

Figure 2:
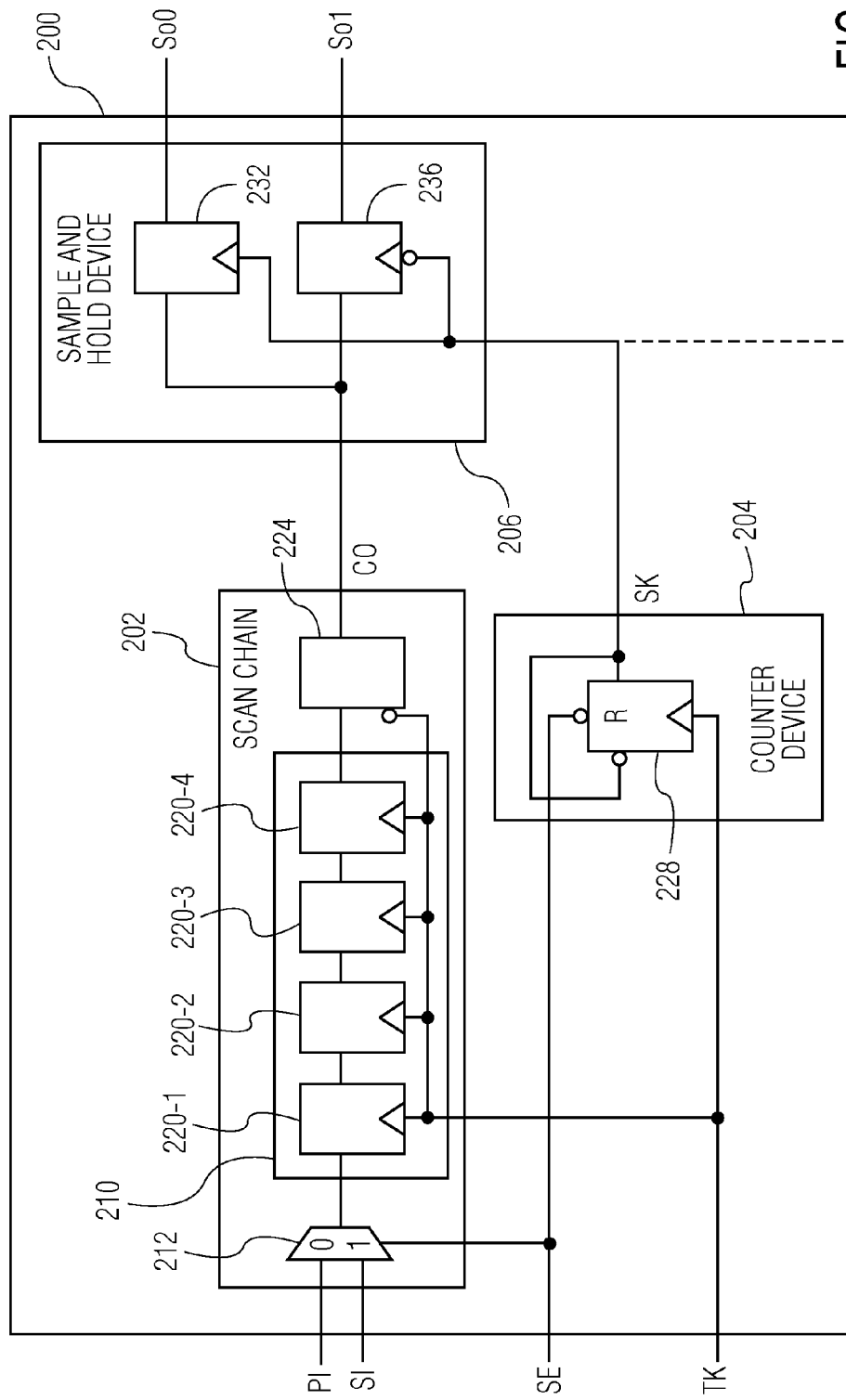
FIG. 2 depicts an embodiment of the circuit testing system depicted in FIG. 1 with an even number of scan chain elements.

In some embodiments, the counter device 104 is configured to divide the frequency of the test clock signal, TK, to generate a sample clock signal, and the frequency of the test clock signal is N times the frequency of the sample clock signal, wherein N is an integer that is larger than 1. In these embodiments, the sample and hold device 106 includes registers configured to receive the scan data and to be driven by the sample clock signal and an inverted version of the sample clock signal. FIG. 2 depicts an embodiment of the circuit testing system 100 depicted in FIG. 1 with an even number of scan chain elements. In the embodiment depicted in FIG. 2, a circuit testing system 200 includes a scan chain 202, a counter device 204, and a sample and hold device 206. The circuit testing system depicted in FIG. 2 is one possible embodiment of the circuit testing system depicted in FIG. 1. However, the circuit testing system depicted in FIG. 1 is not limited to the embodiment shown in FIG. 2.

The scan chain 202 of the circuit testing system 200 contains/hosts a digital circuit under test 210, which includes four digital circuit elements 220-1, 220-2, 220-3, 220-4 that are sequentially connected and can be tested based on a test scan sequence received at the scan chain. In some embodiments, the digital circuit elements are flip-flops or digital logic circuits. In the embodiment depicted in FIG. 2, the scan chain includes a multiplexer 212, from which a primary input signal, "PI," and a scan input signal, "SI," are input and to which a scan enable signal, "SE," is applied, and a latch 224. The primary input signal, PI, is used to carry normal operational data for a regular operation of the digital circuit while the scan input signal, SI, is used to carry a test scan sequence for a scan operation (e.g., a scan shift operation) of the digital circuit. The selection between the primary input signal, PI, and the scan input signal, SI, is governed by the scan enable signal, SE. A test clock signal, "TK," is supplied to the digital circuit. The scan chain generates a chain output signal, "CO," which is output to the sample and hold device 206. The primary input signal, PI, the scan input signal, SI, the scan enable signal, SE, and the test clock signal, TK, are generated and supplied to the scan chain by the tester device (shown in FIG. 1) and/or at least one other tester devices, which can be on-chip or off-chip.

The counter device 204 of the circuit testing system 200 includes a register 228, which is supplied with the clock signal, TK, and driven by the scan enable signal, SE, to provide a defined and repeatable start during a scan operation of the scan chain 202. The counter device is a single bit counter that is configured to divide the frequency of the test clock signal, TK, to generate a sample clock signal, "SK," that runs at half the frequency of the test clock signal, TK, which allows a peripheral buffer (e.g., an scan output terminal/pin) with half drive strength enough time to drive the proper logic value.

The sample and hold device 206 of the circuit testing system 200 is located in the scan output path of the scan chain and includes two registers 232, 236, which are configured to distribute the scan data that is generated by the scan chain 202 over two scan output (So) pins/terminals, "So0," "So1," in a time multiplexing fashion. In the embodiment depicted in FIG. 2, the sample clock signal, SK, from the counter device 204 is fed into clock ports of the registers of the sample and hold device to sample and hold the chain output signal, CO. The register 232 that drives the scan output (So) pin, So0, receives the scan data and is driven by the sample clock signal, SK, and the register 236 that drives the scan output (So) pin, So1, receives the scan data and is driven by an inverted version of the sample clock signal, SK, such that data that is output from the pins, So0, and So1, is updated in an alternating fashion and no data from the chain output signal, CO, is lost. The counter device is asynchronously reset to logic 0 when a scan shift operation is not active. Consequently, the transfer of data from the chain output signal, CO, to the terminals/pins, So0, and So1, is well defined at the start of a shift operation.

Figure 3:
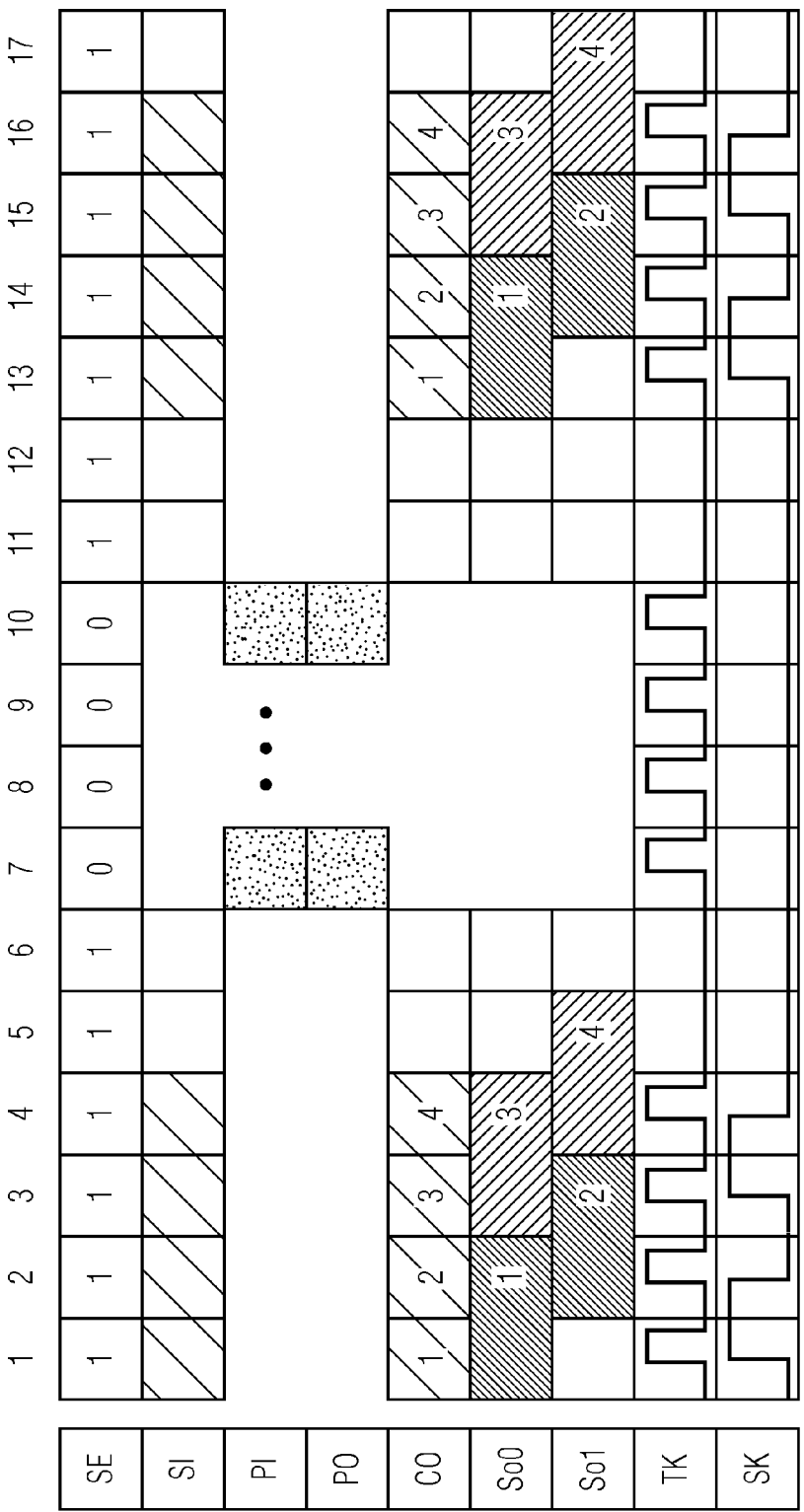
FIG. 3 illustrates a signal diagram of the circuit testing system depicted in FIG. 2.

FIG. 3 illustrates a signal diagram of the circuit testing system 200 depicted in FIG. 2. As illustrated in FIG. 3, the scan enable signal, SE, has a logic value, "1," for the first six time periods (1-6), a value of zero for the next four time periods (7-10), and a logic value, "1," for the next seven time periods (11-17). During the first six time periods (1-6) in which the scan mode is enabled for the circuit testing system, the scan input signal, SI, has a scan test sequence and the test clock signal, TK, is active for the first four time periods (1-4) and the primary input signal, PI, is not enabled/active. Consequently, the chain output signal, CO, is active for the first four time periods (1-4). The sample clock signal, SK, is generated based on the test clock signal, TK, and has half the frequency of the test clock signal, TK and the chain output signal, CO, is alternatingly output from the pins, So0, and So1. During the four time periods (7-10) in which the scan enable signal, SE, has a value of zero, the primary input signal, PI, is enabled and the scan input signal, SI, is not active. Consequently, the chain output signal, CO, is not active for the four time periods (7-10) in which the scan mode is disabled for the circuit testing system. During the seven time periods (11-17) in which the scan mode is enabled for the circuit testing system, the scan input signal, SI, has a scan test sequence and the test clock signal, TK, is active for the four time periods (13-16) and the primary input signal, PI, is not enabled. Consequently, the chain output signal, CO, is active for the four time periods (13-16). The sample clock signal, SK, is generated based on the test clock signal, TK, and has half the frequency of the test clock signal, TK and the chain output signal, CO, is alternatingly output from the pins, So0, and So1.

Figure 4:
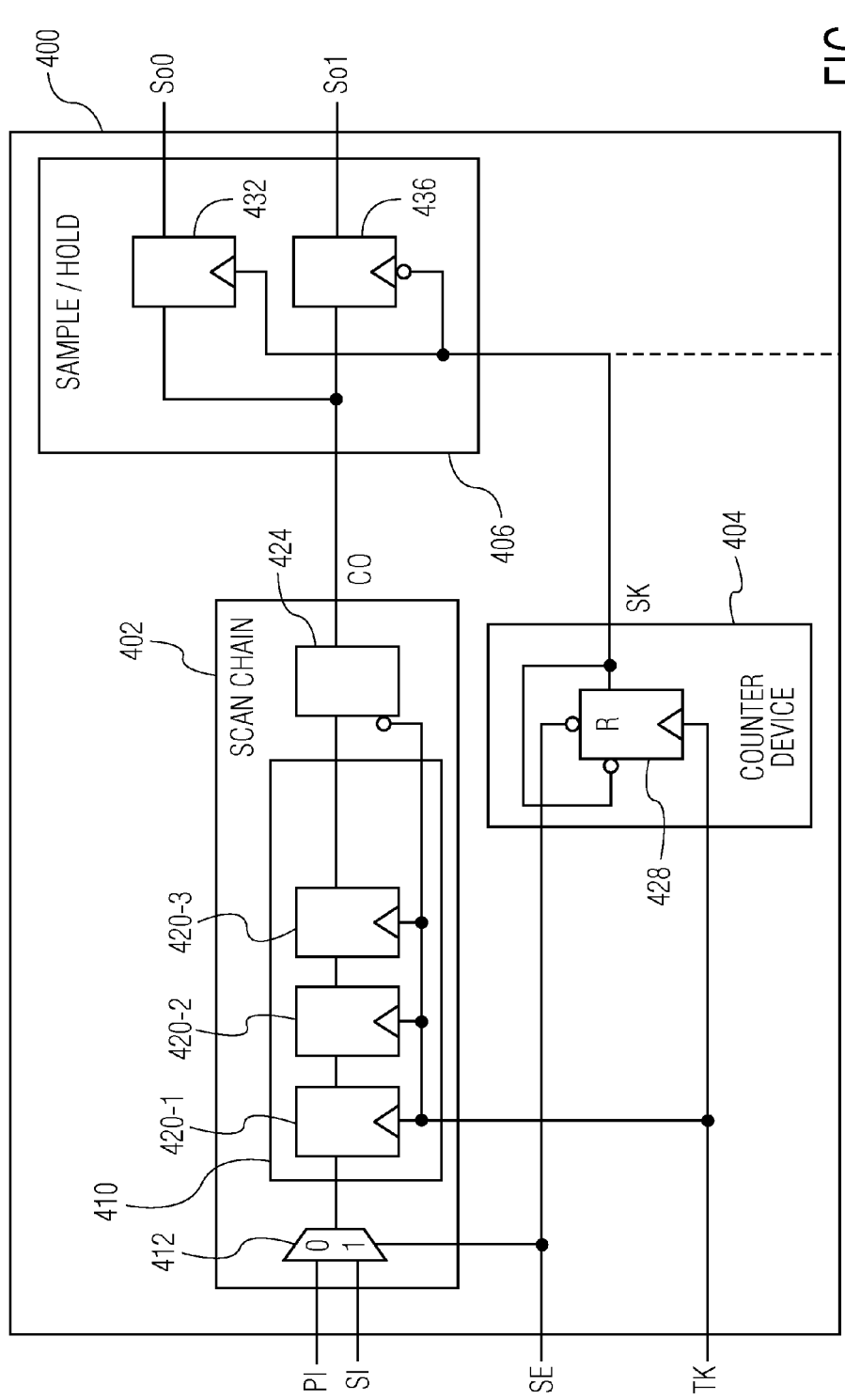
FIG. 4 depicts an embodiment of the circuit testing system depicted in FIG. 1 with an odd number of scan chain elements.

FIG. 4 depicts an embodiment of the circuit testing system 100 depicted in FIG. 1 with an odd number of scan chain elements. In the embodiment depicted in FIG. 4, a circuit testing system 400 includes a scan chain 402, a counter device 404, and a sample and hold device 406. The circuit testing system depicted in FIG. 4 is one possible embodiment of the circuit testing system 100 depicted in FIG. 1. However, the circuit testing system depicted in FIG. 1 is not limited to the embodiment shown in FIG. 4. A difference between the circuit testing system 400 depicted in FIG. 4 and the circuit testing system 200 depicted in FIG. 2 is that the scan chain 402 contains/hosts a digital circuit under test 410, which includes three digital circuit elements 420-1, 420-2, 420-3 that are sequentially connected and can be tested based on a test scan sequence. Similar to the scan chain 202 depicted in FIG. 2, the scan chain 402 also includes a multiplexer 412 and a latch 424. The counter device 404 includes a register 428 and the sample and hold device 406 includes two registers 432, 436. The counter device and the sample and hold device of the circuit testing system 400 depicted in FIG. 4 are similar to or the same as the counter device 204 and the sample and hold device 206 of the circuit testing system 200 depicted in FIG. 2.

Figure 5:
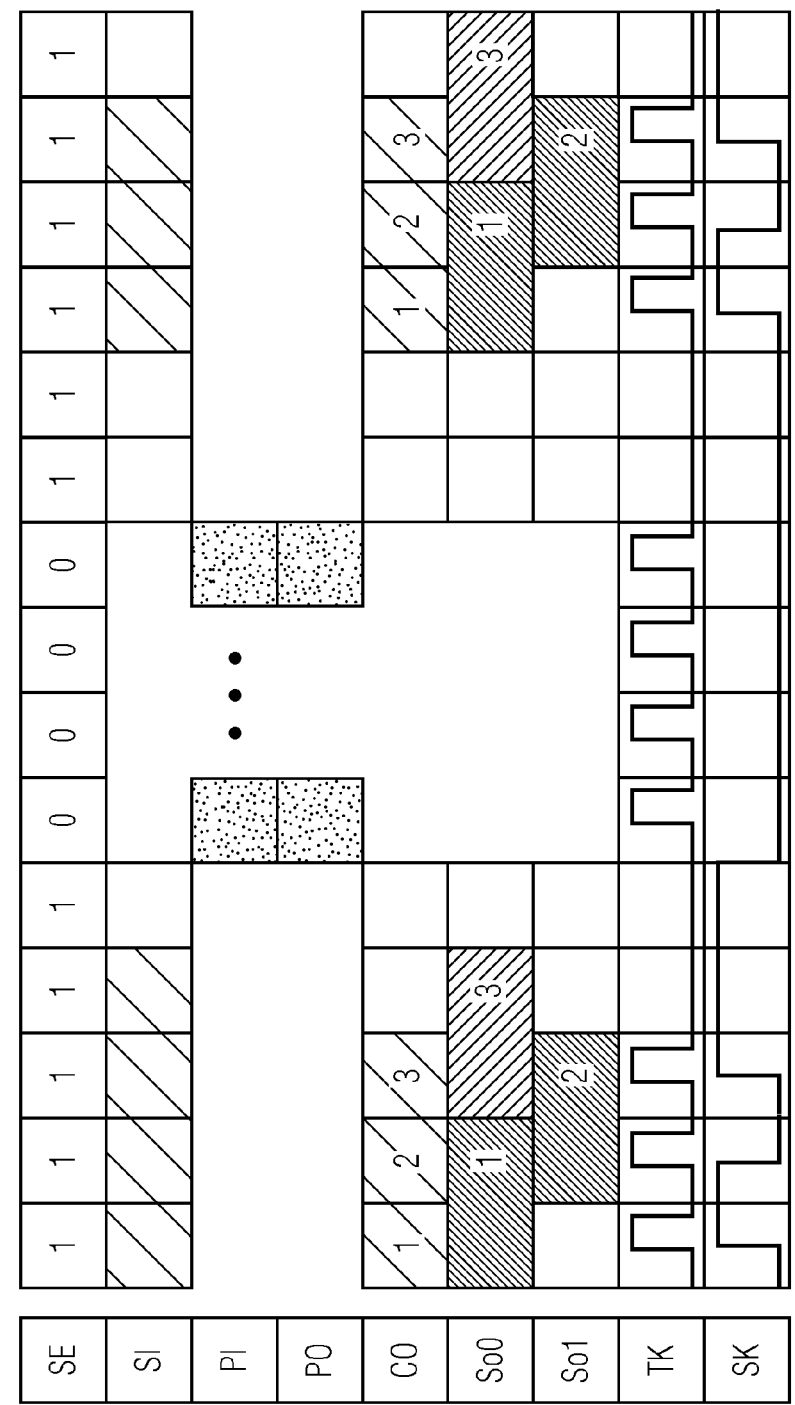
FIG. 5 illustrates a signal diagram of the circuit testing system depicted in FIG. 4.

FIG. 5 illustrates a signal diagram of the circuit testing system 400 depicted in FIG. 4. As illustrated in FIG. 5, the scan enable signal, SE, has a logic value, "1," for the first five time periods (1-5), a value of zero for the next four time periods (6-9), and a logic value, "1," for the next six time periods (10-15). During the first five time periods (1-5) in which the scan mode is enabled for the circuit testing system, the scan input signal, SI, has a scan test sequence and the test clock signal, TK, is active for the first three time periods (1-3) and the primary input signal, PI, is not active/enabled. Consequently, the chain output signal, CO, is active for the first three time periods (1-3). The sample clock signal, SK, is generated based on the test clock signal, TK, and has half the frequency of the test clock signal, TK and the chain output signal, CO, is alternatingly output from the pins, So0, and So1. During the four time periods (6-9) in which the scan enable signal, SE, has a value of zero, the primary input signal, PI, is enabled and the scan input signal, SI, is not active. Consequently, the chain output signal, CO, is not active for the four time periods (6-9) in which the scan mode is disabled for the circuit testing system. During the six time periods (10-15) in which the scan mode is enabled for the circuit testing system, the scan input signal, SI, has a scan test sequence and the test clock signal, TK, is active for the three time periods (12-14) and the primary input signal, PI, is not enabled. Consequently, the chain output signal, CO, is active for the three time periods (12-14). The sample clock signal, SK, is generated based on the test clock signal, TK, and has half the frequency of the test clock signal, TK and the chain output signal, CO, is alternatingly output from the pins, So0, and So1.

Figure 6:
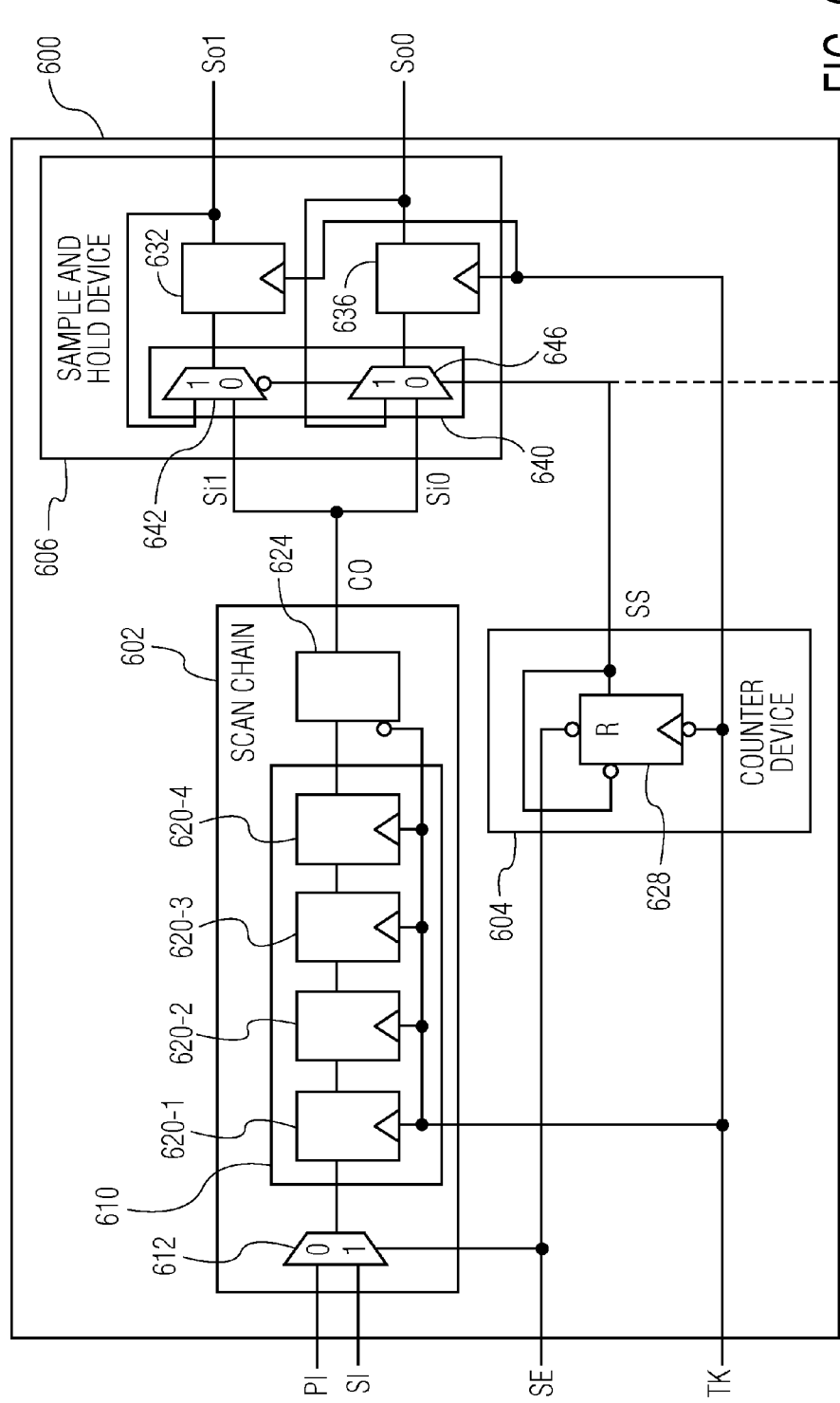
FIG. 6 depicts an embodiment of the circuit testing system depicted in FIG. 1 with a synchronous hold structure and an even number of scan chain elements.

Turning back to FIG. 1, in some embodiments, the counter device 104 is configured to divide the frequency of the test clock signal, TK, to generate a control signal such that the frequency of the control signal is lower than the frequency of the test clock signal. In these embodiments, the sample and hold device 106 includes multiplexers configured to receive the scan data and to be enabled or disabled by the control signal and registers connected to the multiplexers and configured to be driven by the test clock signal, TK. FIG. 6 depicts an embodiment of the circuit testing system 100 depicted in FIG. 1 with an even number of scan chain elements. In the embodiment depicted in FIG. 6, a circuit testing system 600 includes a scan chain 602, a counter device 604, and a sample and hold device 606. The circuit testing system depicted in FIG. 6 is one possible embodiment of the circuit testing system depicted in FIG. 1. However, the circuit testing system depicted in FIG. 1 is not limited to the embodiment shown in FIG. 6. The scan chain, the sample and hold device and the counter device of the circuit testing system depicted in FIG. 6 are similar to or the same as the scan chain 202, the counter device 204, and the sample and hold device 206 of the circuit testing system 200 depicted in FIG. 2.

The scan chain 602 of the circuit testing system 600 contains/hosts a digital circuit under test 610, which includes four digital circuit elements 620-1, 620-2, 620-3, 620-4, that are sequentially connected and can be tested based on a test scan sequence received at the scan chain. In some embodiments, the digital circuit elements are flip-flops or digital logic circuits. In the embodiment depicted in FIG.

6, the scan chain includes a multiplexer 612, from which a primary input signal, "PI," and a scan input signal, "SI," are input and to which a scan enable signal, "SE," is applied, and a latch 624. The primary input signal, PI, is used to carry normal operational data for a regular operation of the digital circuit while the scan input signal, SI, is used to carry a test scan sequence for a scan operation of the digital circuit. The selection between the primary input signal, PI, and the scan input signal, SI, is governed by the scan enable signal, SE. A test clock signal, "TK," is supplied to the digital circuit. The scan chain generates a chain output signal, "CO," which is output to the sample and hold device. The primary input signal, PI, the scan input signal, SI, the scan enable signal, SE, and the test clock signal, TK, are generated and supplied to the scan chain by the tester device (shown in FIG. 1) and/or at least one other tester devices.

The counter device 604 of the circuit testing system 600 includes a register 628, which is supplied with the clock signal, TK, and driven by the scan enable signal, SE, to provide a defined and repeatable start during a scan operation of the scan chain 602. The counter device is a single bit counter that is configured to divide the frequency of the test clock signal, TK, to generate a sample output signal, "SS," that runs at half the frequency of the test clock signal, TK, which allows a peripheral buffer with half drive strength enough time to drive the proper logic value.

The sample and hold device 606 of the circuit testing system 600 is located in the scan output path of the scan chain 602 and includes two registers 632, 636 and a synchronous hold structure 640 that includes two multiplexers 642, 646 and is controlled by the counter output SS. The sample and hold device is configured to distribute the scan data that is generated by the scan chain over two scan output (So) pins/terminals, "So0," "So1," in a time multiplexing fashion. In the embodiment depicted in FIG. 6, the sample output signal, SS, from the counter device is fed into control ports of the two multiplexers and the test clock signal, TK, is input into a clock port of the register 636 and a clock port of the register 632. Controlled by the two multiplexers, values of the signals output from the scan output (So) pins, So0, and So1, change every two cycles of the test clock signal, TK, which results in half the frequency of the test clock signal, TK.

Figure 7:
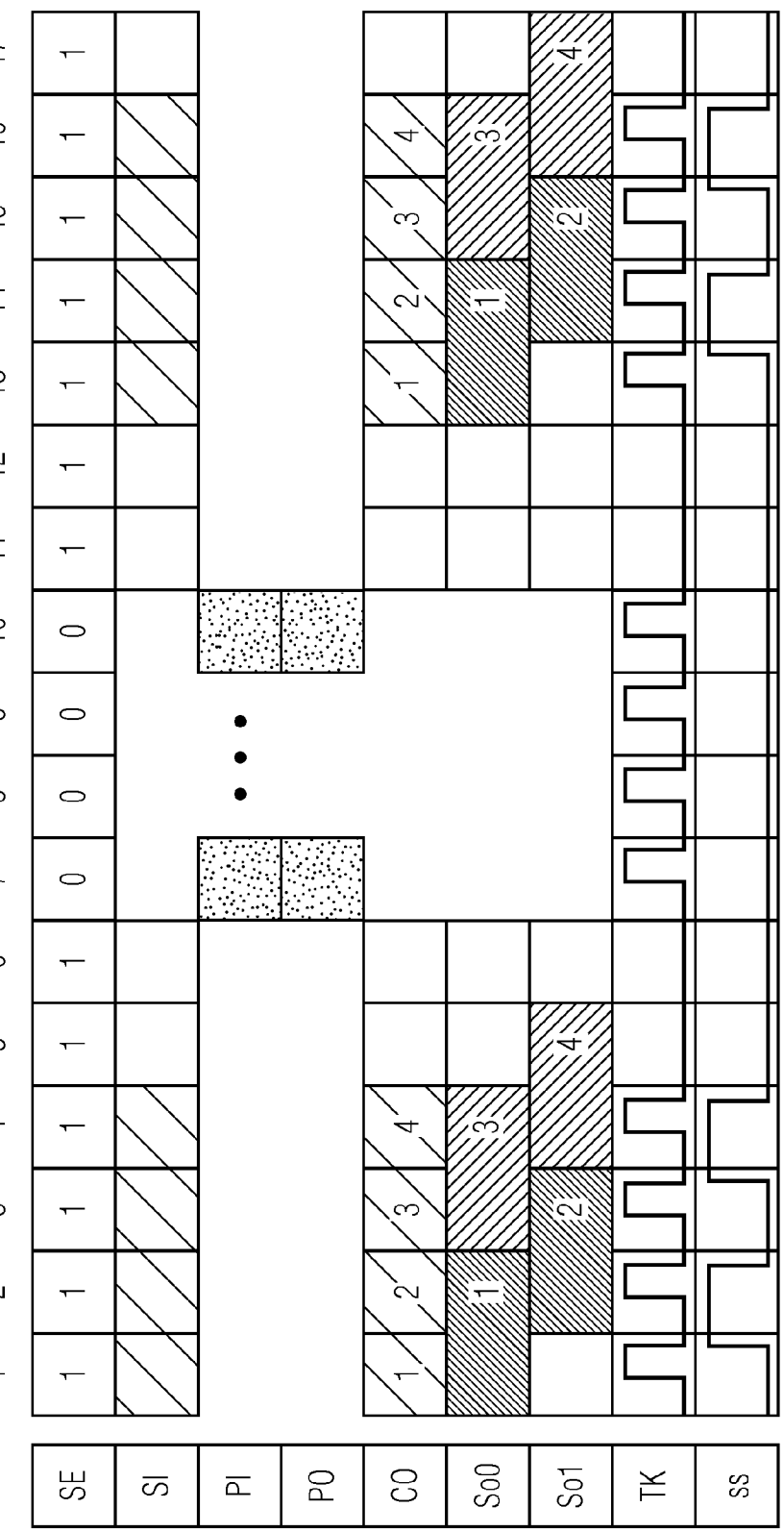
FIG. 7 illustrates a signal diagram of the circuit testing system depicted in FIG. 6.

FIG. 7 illustrates a signal diagram of the circuit testing system 600 depicted in FIG. 6. As illustrated in FIG. 7, the scan enable signal, SE, has a logic value, "1," for the first six time periods (1-6), a value of zero for the next four time periods (7-10), and a logic value, "1," for the next seven time periods (11-17). During the first six time periods (1-6) in which the scan mode is enabled for the circuit testing system, the scan input signal, SI, has a scan test sequence and the test clock signal, TK, is active for the first four time periods (1-4) and the primary input signal, PI, is not enabled. Consequently, the chain output signal, CO, is active for the first four time periods (1-4). The sample output signal, SS, is generated based on the test clock signal, TK, and has half the frequency of the test clock signal, TK and the chain output signal, CO, is alternatingly output from the pins, So0, and So1. During the four time periods (7-10) in which the scan enable signal, SE, has a value of zero, the primary input signal, PI, is enabled and the scan input signal, SI, is not active. Consequently, the chain output signal, CO, is not active for the four time periods (7-10) in which the scan mode is disabled for the circuit testing system. During the seven time periods (11-17) in which the scan mode is enabled for the circuit testing system, the scan input signal, SI, has a scan test sequence and the test clock signal, TK, is active for the four time periods (13-16) and the primary input signal, PI, is not enabled. Consequently, the chain output signal, CO, is active for the four time periods (13-16). The sample output signal, SS, is generated based on the test clock signal, TK, and has half the frequency of the test clock signal, TK and the chain output signal, CO, is alternatingly output from the pins, So0, and So1.

Figure 8:
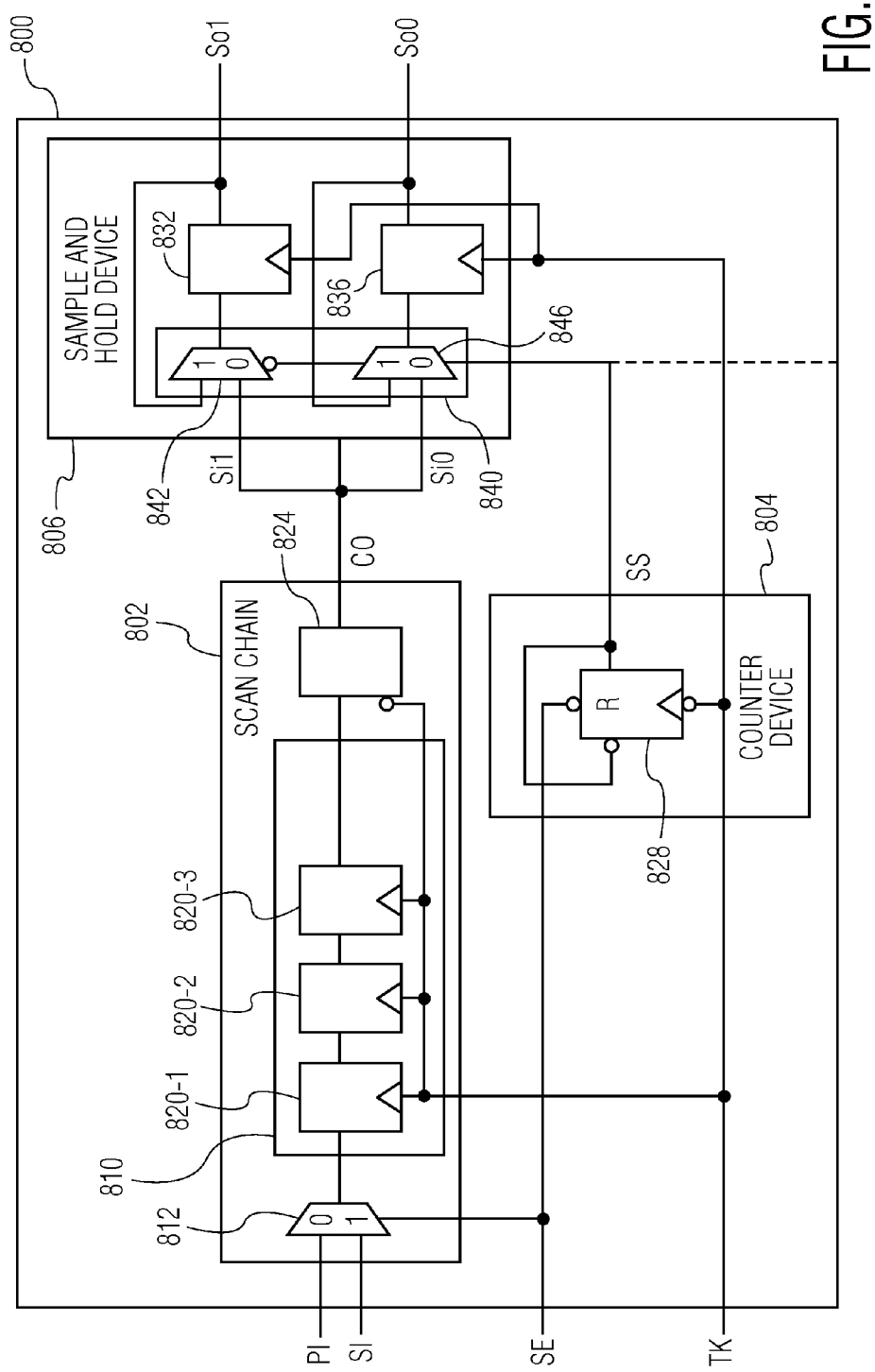
FIG. 8 depicts an embodiment of the circuit testing system depicted in FIG. 1 with a synchronous hold structure and an odd number of scan chain elements.

FIG. 8 depicts an embodiment of the circuit testing system 100 depicted in FIG. 1 with an odd number of scan chain elements. In the embodiment depicted in FIG. 8, a circuit testing system 800 includes a scan chain 802, a counter device 804, and a sample and hold device 806. The circuit testing system depicted in FIG. 8 is one possible embodiment of the circuit testing system depicted in FIG. 1. However, the circuit testing system depicted in FIG. 1 is not limited to the embodiment shown in FIG. 8. A difference between the circuit testing system 800 depicted in FIG. 8 and the circuit testing system 600 depicted in FIG. 6 is that the scan chain contains/hosts a digital circuit under test 810, which includes three digital circuit elements 820-1, 820-2, 820-3 that are sequentially connected and can be tested based on a test scan sequence. Similar to the scan chain 602 depicted in FIG. 6, the scan chain 802 also includes a multiplexer 812 and a latch 824. The counter device 804 includes a register 828 and the sample and hold device 806 includes two registers 832, 836 and a synchronous hold structure 840 that includes two multiplexers 842, 846. The counter device and the sample and hold device of the circuit testing system 800 depicted in FIG. 8 are similar to or the same as the counter device 604 and the sample and hold device 606 of the circuit testing system 600 depicted in FIG. 6.

Figure 9:
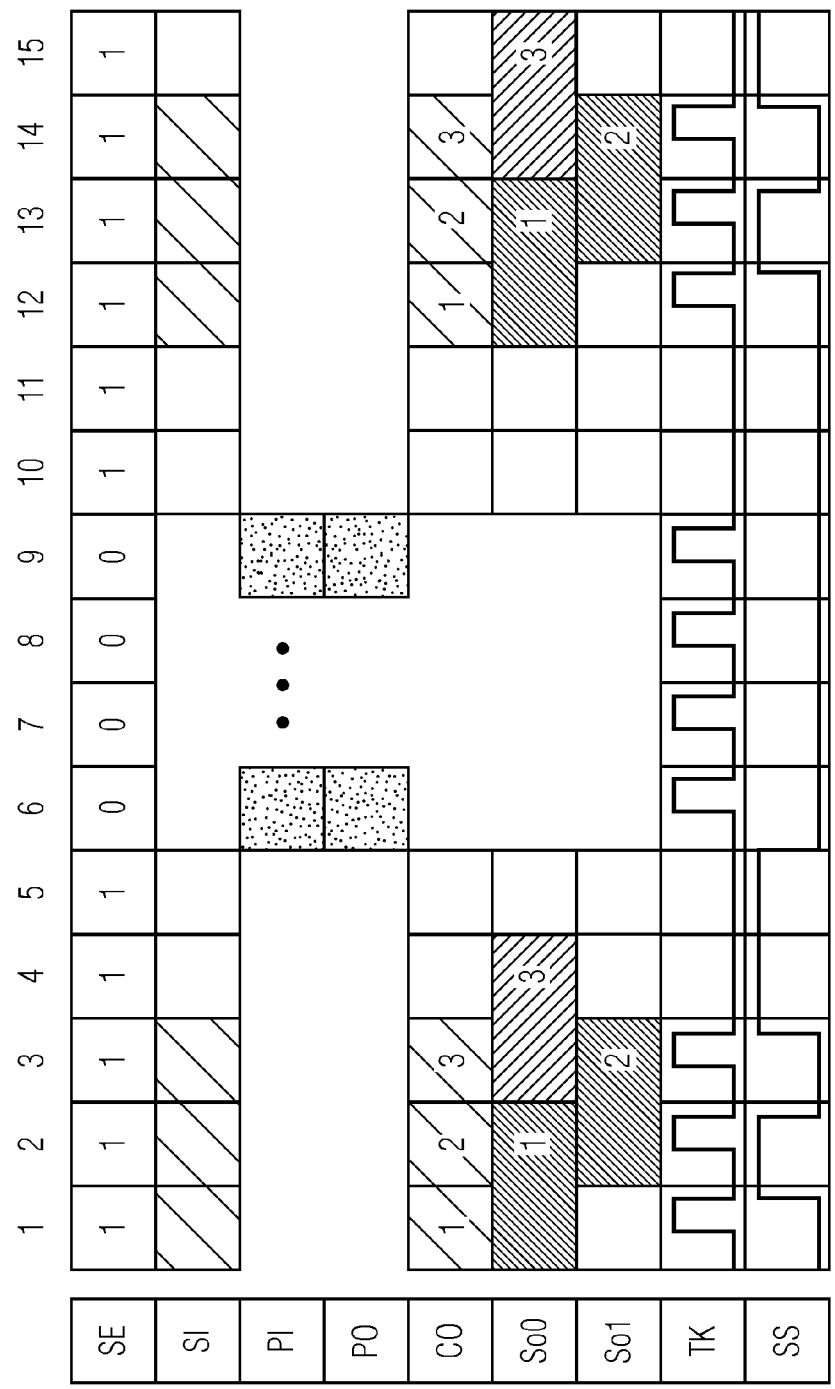
FIG. 9 illustrates a signal diagram of the circuit testing system depicted in FIG. 8.

FIG. 9 illustrates a signal diagram of the circuit testing system 800 depicted in FIG. 8. As illustrated in FIG. 9, the scan enable signal, SE, has a logic value, "1," for the first five time periods (1-5), a value of zero for the next four time periods (6-9), and a logic value, "1," for the next six time periods (10-15). During the first five time periods (1-5) in which the scan mode is enabled for the circuit testing system, the scan input signal, SI, has a scan test sequence and the test clock signal, TK, is active for the first three time periods (1-3) and the primary input signal, PI, is not enabled. Consequently, the chain output signal, CO, is active for the first three time periods (1-3). The sample output signal, SS, is generated based on the test clock signal, TK, and has half the frequency of the test clock signal, TK, and the chain output signal, CO, is alternatingly output from the pins, So0, and So1. During the four time periods (6-9) in which the scan enable signal, SE, has a value of zero, the primary input signal, PI, is enabled and the scan input signal, SI, is not active. Consequently, the chain output signal, CO, is not active for the four time periods (6-9) in which the scan mode is disabled for the circuit testing system. During the six time periods (10-15) in which the scan mode is enabled for the circuit testing system, the scan input signal, SI, has a scan test sequence and the test clock signal, TK, is active for the three time periods (12-14) and the primary input signal, PI, is not enabled. Consequently, the chain output signal, CO, is active for the three time periods (12-14). The sample output signal, SS, is generated based on the test clock signal, TK, and has half the frequency of the test clock signal, TK and the chain output signal, CO, is alternatingly output from the pins, So0, and So1.

Figure 10:
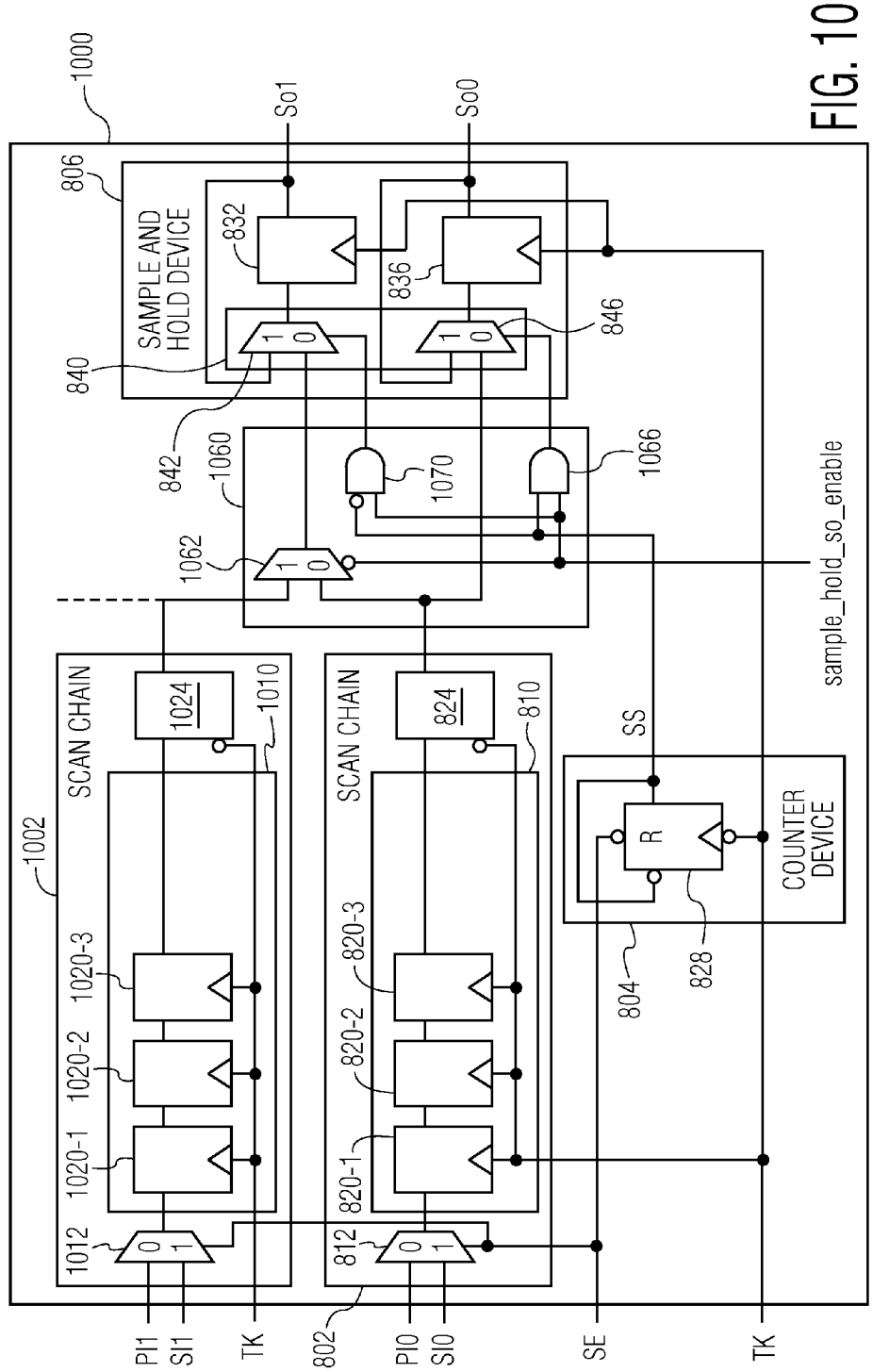
FIG. 10 depicts an embodiment of the circuit testing system depicted in FIG. 1 with multiple scan chains.

In some embodiments, the circuit testing system 100 depicted in FIG. 1 uses multiple scan chains. FIG. 10 depicts an embodiment of the circuit testing system 100 depicted in FIG. 1 with multiple scan chains. In the embodiment depicted in FIG. 10, a circuit testing system 1000 includes a first scan chain 1002 without a sample and hold feature, a second scan chain 802 that uses a sample and hold output feature, a scan chain switch circuit 1060, the counter device 804, and the sample and hold device 806. The circuit testing system depicted in FIG. 10 is one possible embodiment of the circuit testing system depicted in FIG. 1. However, the circuit testing system depicted in FIG. 1 is not limited to the embodiment shown in FIG. 10.

The first scan chain 1002 contains/hosts a digital circuit under test 1010, which includes three digital circuit elements 1020-1, 1020-2, 1020-3 that are sequentially connected and can be tested based on a test scan sequence. In the embodiment depicted in FIG. 10, the first scan chain includes a multiplexer 1012, from which a primary input signal, "PH," and a scan input signal, "SI1," are input, and a latch 1024. A scan enable signal may be applied to the first scan chain. The primary input signal, PH, is used to carry normal operational data for a regular operation of the digital circuit while the scan input signal, SI1, is used to carry a test scan sequence for a scan operation of the digital circuit. The selection between the primary input signal, PH, and the scan input signal, SI1, is governed by a scan enable signal that is applied to the first scan chain. A test clock signal, "TK", is supplied to the digital circuit. The scan chain generates a chain output signal, which is output to the scan chain switch circuit 1060. The second scan chain 802 includes the multiplexer 812 from which a primary input signal, "PI0," and a scan input signal, "SI0," are input, and the latch 824 and contains/hosts the digital circuit under test 810, which includes the three digital circuit elements 820-1, 820-2, 820-3.

Figure 11:
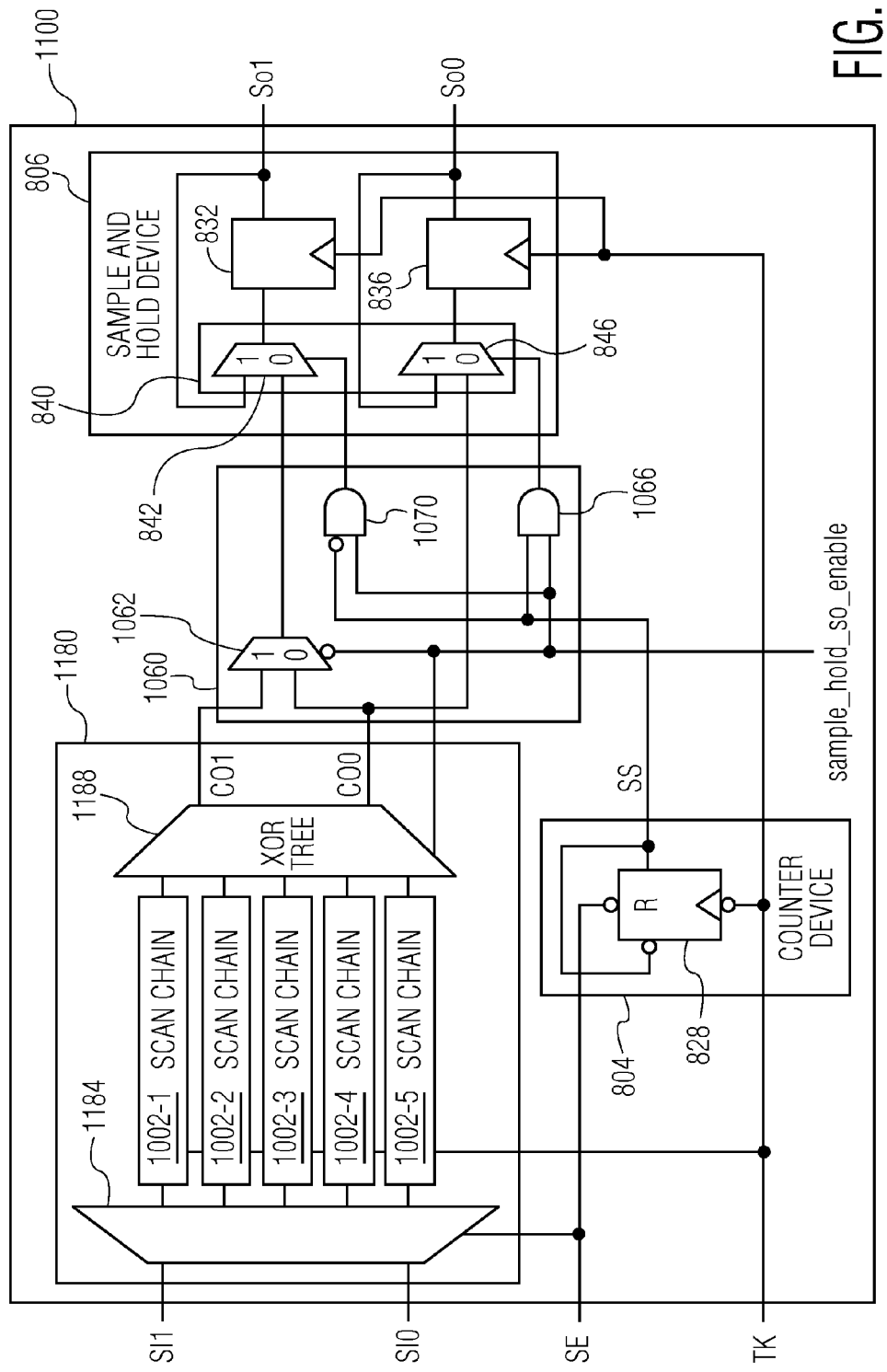
FIG. 11 depicts an embodiment of the circuit testing system depicted in FIG. 1 with multiple scan chains embedded in a test data compression environment.

The scan chain switch circuit 1060 includes a multiplexer 1062, an AND gate 1066, and an AND gate with an inverted input 1070. The sample output signal, SS, is applied to the AND gate 1066 and to the AND gate 1070 and a control signal, "sample_hold_so_enable," is applied to the multiplexer, to the AND gate 1066, and to the AND gate 1070. The control signal, "sample_hold_so_enable," is used to control the scan chain switch circuit to switch between the scan chain 1002 that does not have the sample and hold feature and the scan chain 802 that does have the sample and hold feature. For example, when the control signal, "sample_hold_so_enable," is set to one, the scan chain 802 is selected. When the control signal, "sample_hold_so_enable," is set to zero, the scan chain 1002 feeds into the scan output (So) pin, So1, via the register 832 and the scan chain 802 feeds into the scan output pin, So0, via the register 836. In the embodiment depicted in FIG. 10, signals from the AND gate 1066 and the AND gate 1070 of the scan chain switch circuit are fed into control ports of the two multiplexers 842, 846. Controlled by the two multiplexers, the frequency at which the signals are output from the scan output (So) pins, So0, and So1, is half the frequency of the test clock signal, TK, when the scan chain 802 is used. When the scan chain 1002 is used, signals are output from the pin, So0, at the frequency of the test clock signal, TK In some embodiments, the circuit testing system 100 depicted in FIG. 1 uses multiple scan chains that are embedded in a test data compression environment. FIG. 11 depicts an embodiment of the circuit testing system 100 depicted in FIG. 1 with multiple scan chains embedded in a test data compression environment. In the embodiment depicted in FIG. 11, a circuit testing system includes a test data compression environment 1180, the scan chain switch circuit 1060, the counter device 804, and the sample and hold device 806. The circuit testing system depicted in FIG. 11 is one possible embodiment of the circuit testing system depicted in FIG. 1. However, the circuit testing system depicted in FIG. 1 is not limited to the embodiment shown in FIG. 11.

In the embodiment depicted in FIG. 11, the test data compression environment 1180 includes a test environment 1184, which translates channel input signals, "SI1," "SI0," into input data for five scan chains 1002-1, 1002-2, 1002-3, 1002-4, 1002-5. Multiple chain outputs are fed into an XOR tree 1188 of the test data compression environment to converge expected data into output channels, "CO1," "CO0." The test environment can be implemented with multiple configurations of the XOR tree. In the embodiment depicted in FIG. 11, two configurations can be created using the control signal, "sample_hold_so_enable." In a first configuration, the control signal, sample_hold_so_enable, is set to 0, and scan data from all of the scan chains are fed into two channel outputs, CO1 and CO0, via the XOR tree. In the first configuration, the channel output, CO1, is fed into the output pin, So1, via the register 832 and the channel output, CO0, is fed into the output pin, So0, via the register 836. In a second configuration, the control signal, sample_hold_so_enable, is set to 1, and scan data from all of the scan chains is fed into a single channel output, CO0, via the XOR tree. The channel output, CO0, is fed into the output pins, So1 and So0, via the sample and holder device 806 that is controlled to update values in an alternating fashion under control of the counter output.

Figure 12:
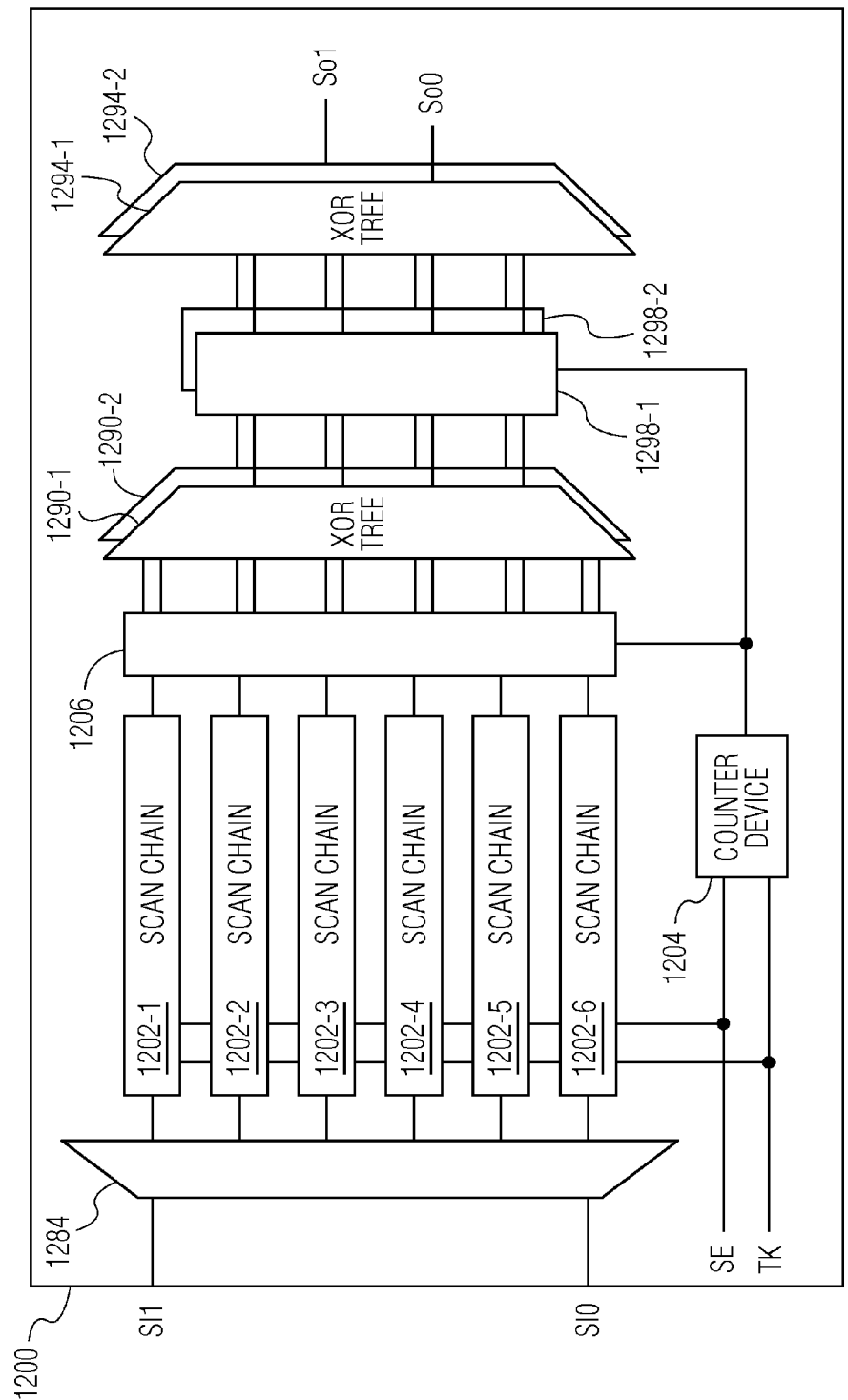
FIG. 12 depicts an embodiment of the circuit testing system depicted in FIG. 1 in which a sample and hold device is implemented in the signal path in front of XOR tree structures.

In some embodiments, the sample and hold device 106 is implemented in the scan signal path in front of XOR tree structures. FIG. 12 depicts an embodiment of the circuit testing system 100 depicted in FIG. 1 in which the sample and hold device is implemented in the scan signal path in front of XOR tree structures. In the embodiment depicted in FIG. 12, a circuit testing system 1200 includes a test environment 1284, six scan chains 1202-1, 1202-2, 1202-3, 1202-4, 1202-5, 1202-6, a counter device 1204, a sample and hold device 1206, XOR trees 1290-1, 1290-2, 1294-1, 1294-2, and optional pipeline stages 1298-1, 1298-2. The pipeline stage 1298-1 links the XOR tree 1290-1 with the XOR tree 1294-1 and the pipeline stage 1298-2 links the XOR tree 1290-2 with the XOR tree 1294-2. In an embodiment, the pipeline stages are used to limit the logic depth of XOR trees to increase the maximum frequency of the scan shift operation. The circuit testing system depicted in FIG. 12 is one possible embodiment of the circuit testing system depicted in FIG. 1. However, the circuit testing system depicted in FIG. 1 is not limited to the embodiment shown in FIG. 12.

Figure 13:
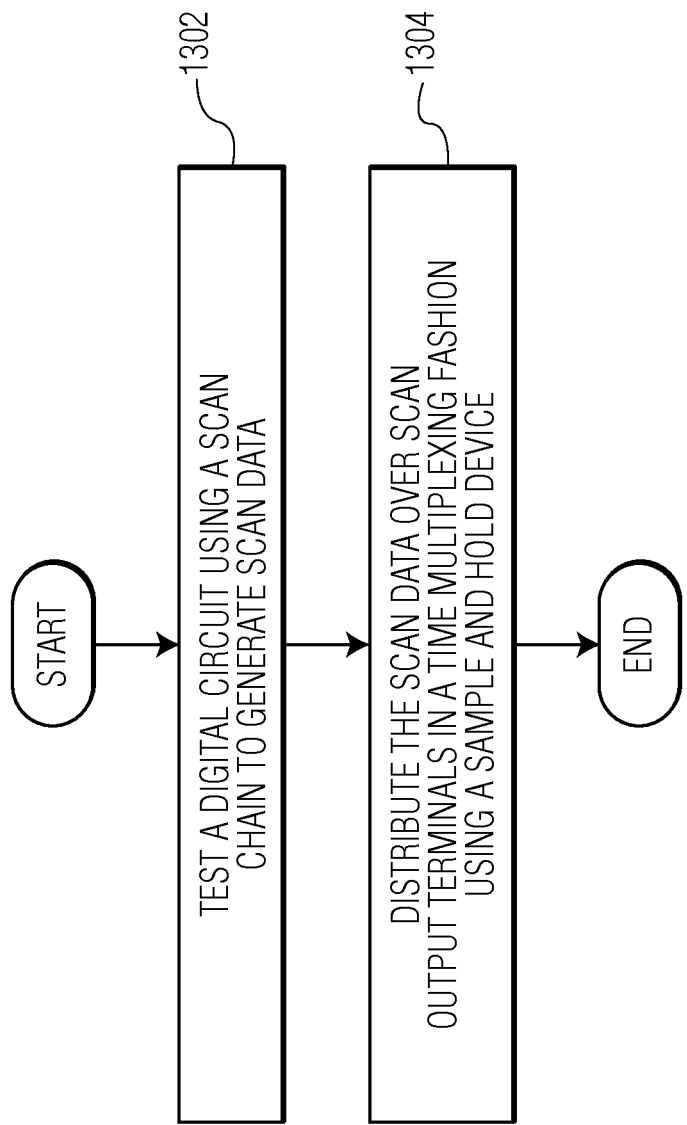
FIG. 13 is a process flow diagram of a method for scan testing a digital circuit in accordance with an embodiment of the invention.

FIG. 13 is a process flow diagram of a method for digital circuit scan testing in accordance with an embodiment of the invention. At block 1302, a digital circuit is tested using a scan chain to generate scan data. At block 1304, the scan data is distributed over scan output terminals using a sample and hold device. The scan chain may be similar to or the same as the scan chains depicted in FIGS. 1, 2, 4, 6, 8, and 10-12. The sample and hold device may be similar to or the same as the sample and hold devices depicted in FIGS. 1, 2, 4, 6, 8, and 10-12.

Figure 14:
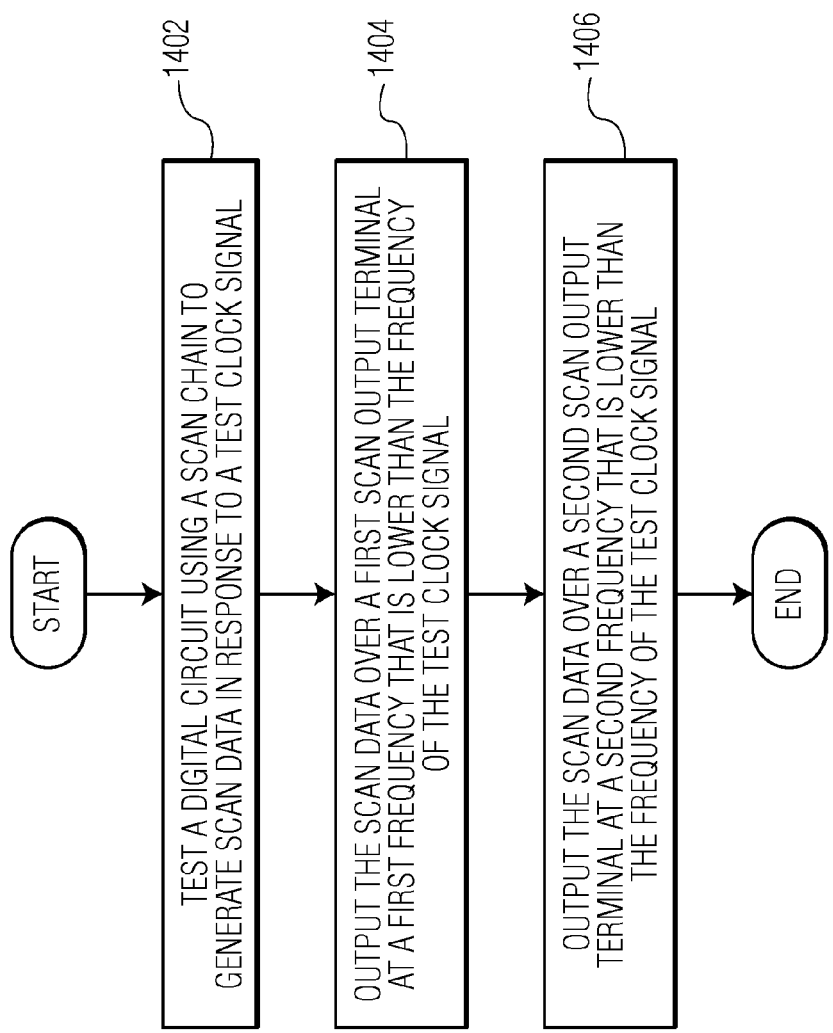
FIG. 14 is a process flow diagram of a method for digital circuit scan testing in accordance with an embodiment of the invention.

FIG. 14 is a process flow diagram of a method for digital circuit scan testing in accordance with an embodiment of the invention. At block 1402, a digital circuit is tested using a scan chain to generate scan data in response to a test clock signal. At block 1404, the scan data is output over a first scan output terminal at a first frequency that is lower than the frequency of the test clock signal. At block 1406, the scan data is output over a second scan output terminal at a second frequency that is lower than the frequency of the test clock signal. The scan chain may be similar to or the same as the scan chains depicted in FIGS. 1, 2, 4, 6, 8, and 10-12.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more features.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A method for digital circuit scan testing, the method comprising:
    testing a digital circuit using a scan chain to generate scan data at a frequency of a test clock signal;
    dividing the frequency of the test clock signal to generate a sample clock signal; and
    distributing the scan data over a plurality of scan output terminals using a sample and hold device, wherein the scan data is received at an input of the sample and hold device at the frequency of the test clock signal, and wherein distributing the scan data over the scan output terminals comprises outputting the scan data through the scan output terminals at a frequency of the sample clock signal.

2. The method of claim 1, wherein the frequency of the test clock signal is N times the frequency of the sample clock signal, wherein N is an integer that is larger than 1, and wherein distributing the scan data over the scan output terminals comprises driving a plurality of registers of the sample and hold device with the sample clock signal and an inverted version of the sample clock signal.

3. The method of claim 1, the frequency of the sample clock signal is half the frequency of the test clock signal, and wherein distributing the scan data over the scan output terminals comprises:
    driving a first register of the sample and hold device with the sample clock signal; and
    driving a second register of the sample and hold device with an inverted version of the sample clock signal.

4. The method of claim 1, wherein the sample clock signal comprises a control signal, wherein the frequency of the test clock signal is N times the frequency of the control signal, wherein N is an integer that is larger than 1, and wherein distributing the scan data over the scan output terminals comprises:
    supplying the test clock signal to a plurality of registers of the sample and hold device; and
    supplying the control signal to a plurality of multiplexers of the sample and hold device.

5. The method of claim 1, wherein the sample clock signal comprises a control signal such that the frequency of the control signal is lower than the frequency of the test clock signal, and wherein distributing the scan data over the scan output terminals comprises:
    supplying the scan data to a plurality of multiplexers of the sample and hold device, selection by the multiplexor of the scan data determined based on the control signal; and
    supplying the test clock signal to a plurality of registers of the sample and hold device, an input of each register of the plurality of registers coupled to an output of a respective multiplexor of the plurality of multiplexors.

6. The method of claim 1, further comprising:
    testing a second digital circuit using a second scan chain to generate second scan data; and
    outputting the second scan data through the scan output terminals.

7. The method of claim 1, further comprising:
    receiving channel input signals at the scan chain;
    translating the channel input signals into test scan sequences for a plurality of scan chains, wherein the scan chains comprise the scan chain and a second scan chain;
    testing a second digital circuit using the second scan chain to generate second scan data; and
    outputting the second scan data through an XOR tree and the scan output terminals.

8. The method of claim 1, wherein testing the digital circuit using the scan chain comprises supplying a test scan sequence, a test enable signal, and a test clock signal to the scan chain.

9. The method of claim 1, wherein the digital circuit is located in the scan chain.

10. The method of claim 1, wherein the digital circuit comprises an even number of scan chain elements.

11. The method of claim 1, wherein the digital circuit comprises an odd number of scan chain elements.

12. A system for digital circuit scan testing, the system comprising:
    a scan chain containing a digital circuit, wherein the scan chain is configured to test the digital circuit in response to a test clock signal to generate scan data at a frequency of the test clock signal;
    a counter device configured to divide the frequency of the test clock signal to generate a sample clock signal; and
    a sample and hold device configured to distribute the scan data over a plurality of scan output terminals, wherein the scan data is received at an input of the sample and hold device at the frequency of the test clock signal, and wherein distributing the scan data over the scan output terminals comprises outputting the scan data through the scan output terminals at a frequency of the sample clock signal.

13. The system of claim 12, wherein the frequency of the test clock signal is N times the frequency of the sample clock signal, wherein N is an integer that is larger than 1, and wherein the sample and hold device comprises a plurality of registers configured to receive the scan data and to be driven by the sample clock signal and an inverted version of the sample clock signal.

14. The system of claim 12, wherein the frequency of the sample clock signal is half the frequency of the test clock signal, and wherein the sample and hold device comprises:
    a first register configured to receive the scan data and to be driven by the sample clock signal; and
    a second register configured to receive the scan data and to be driven by an inverted version of the sample clock signal.

15. The system of claim 12, wherein the sample clock signal comprises a control signal, and wherein the sample and hold device comprises:

a plurality of multiplexers configured to receive the scan data, selection of the scan data controlled by the control signal; and a plurality of registers connected to the multiplexers and configured to be driven by the test clock signal, an input of each register of the plurality of registers coupled to an output of a respective multiplexor of the plurality of multiplexors.

16. The system of claim 12, wherein the digital circuit comprises an even number of scan chain elements.

17. The system of claim 12, wherein the digital circuit comprises an odd number of scan chain elements.

18. A method for digital circuit scan testing, the method comprising:

testing a digital circuit using a scan chain to generate scan data at a frequency of a test clock signal;

receiving the scan data at an input of a sample and hold device at the frequency of the test clock signal;

outputting the scan data over a first scan output terminal of the sample and hold device at a first frequency that is lower than the frequency of the test clock signal; and outputting the scan data over a second scan output terminal of the sample and hold device at a second frequency that is lower than the frequency of the test clock signal.

* * * * *